United States Patent
Strnad

(10) Patent No.: US 6,563,227 B1
(45) Date of Patent: *May 13, 2003

(54) TEMPERATURE CONTROL METHOD FOR INTEGRATED CIRCUIT

(75) Inventor: Richard J. Strnad, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/228,789

(22) Filed: Aug. 27, 2002

Related U.S. Application Data

(62) Division of application No. 09/866,976, filed on May 29, 2001, now Pat. No. 6,476,508, which is a division of application No. 09/216,282, filed on Dec. 18, 1998, now Pat. No. 6,281,120.

(51) Int. Cl.[7] .......................... H01L 23/38; H01L 27/16
(52) U.S. Cl. .................. 257/930; 257/467; 257/712; 257/713
(58) Field of Search ................ 257/930, 467, 257/712, 713

(56) References Cited

U.S. PATENT DOCUMENTS

| | | | |
|---|---|---|---|
| 3,766,444 A | 10/1973 | Bosch | 317/234 |
| 4,058,779 A | 11/1977 | Fraley | 331/108 |
| 4,757,528 A | 7/1988 | Falater et al. | 379/412 |
| 4,812,733 A | 3/1989 | Tobey | 323/285 |
| 4,935,864 A | 6/1990 | Schmidt et al. | 363/141 |
| 5,079,618 A | 1/1992 | Farnworth | 357/81 |
| 5,166,777 A | 11/1992 | Kataoka | 257/716 |
| 5,188,286 A | 2/1993 | Pence, IV | 236/1 |
| 5,229,327 A | 7/1993 | Farnworth | 437/209 |
| 5,267,252 A | 11/1993 | Amano | 372/34 |
| 5,419,780 A | 5/1995 | Suski | 136/205 |
| 5,430,322 A | 7/1995 | Koyanagi et al. | 257/467 |
| 5,457,342 A | 10/1995 | Herbst, II | 257/712 |
| 5,515,682 A | 5/1996 | Nagakubo et al. | 62/3.7 |
| 5,689,958 A | 11/1997 | Gaddis et al. | 62/3.7 |
| 5,697,082 A | 12/1997 | Greer et al. | 455/255 |
| 5,706,302 A | 1/1998 | Shimizu | 372/36 |
| 5,714,791 A | 2/1998 | Chi et al. | 257/467 |
| 5,724,818 A | 3/1998 | Iwata et al. | 62/3.7 |
| 5,832,601 A | 11/1998 | Eldridge et al. | 29/843 |
| 5,874,775 A * | 2/1999 | Shiomi et al. | 257/712 |
| 6,066,561 A | 5/2000 | Kumar et al. | 438/689 |
| 6,107,108 A | 8/2000 | Chen et al. | 438/14 |

OTHER PUBLICATIONS

H.R. Shanks, P.D. Maycock et al., "Thermal Conductivity of Silicon from 300 to 1400 K", *Physical Review*, vol. 130, No. 5, Jun. 1, 1963, pp. 1743–1748.

Wynand J. Louw et al., "Inductor–less, Capacitor–less State–Variable Electrothermal Filters", *IEEE Journal of Solid–State Circuits*, vol. SC–12, No. 4, Aug. 1977, pp. 416–424.

E.L. Heasell, "The Heat–Flow Problem in Silicon: An Approach to an Analytical Solution with Application to the Calculation of Thermal Instability in Bipolar Devices", *IEEE Transactions On Electron Devices*, vol. ED–25, No. 12, Dec. 1978, pp. 1382, 1384, 1386, 1388.

* cited by examiner

*Primary Examiner*—David Nelms
*Assistant Examiner*—Tu-Tu Ho
(74) *Attorney, Agent, or Firm*—Stallman & Pollock LLP

(57) ABSTRACT

Application of a potential difference across a doped region formed on an integrated circuit allows management of thermal energy directly on the chip surface. Individual temperature control cells are formed by ion implanting N- and P-type dopant into adjacent regions, and then forming a metal bridge across the similarly positioned ends. Placing a potential drop across metal contacts of the cell changes the temperature of the contacts relative to that of the electrically conducting bridge. Fabrication of arrays of temperature control cells of various shapes and sizes permits extremely precise heating and cooling of specific regions of the integrated circuit. Management of thermal energy on the IC in accordance with the present invention may be enhanced by forming arrays of temperature control cells possessing multiple tiers.

5 Claims, 5 Drawing Sheets

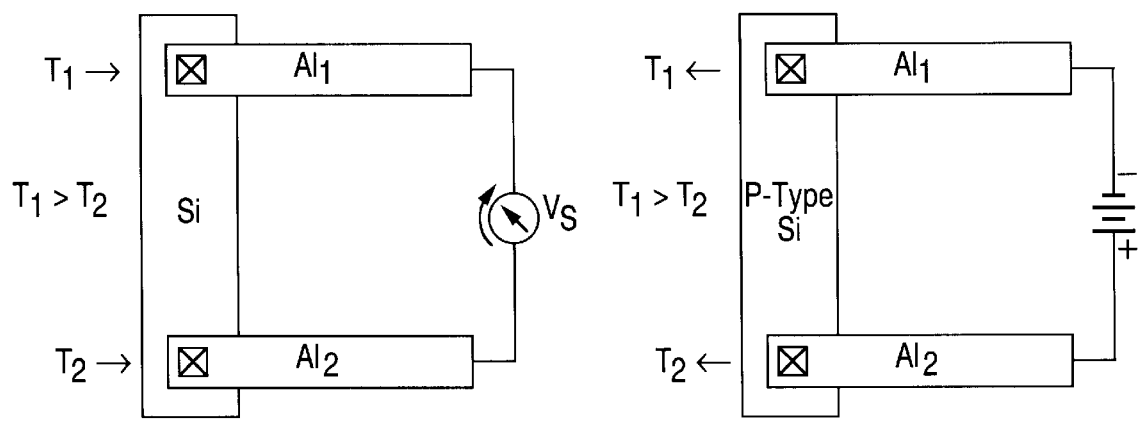
FIG. 1
(PRIOR ART)
FIG. 2
(PRIOR ART)
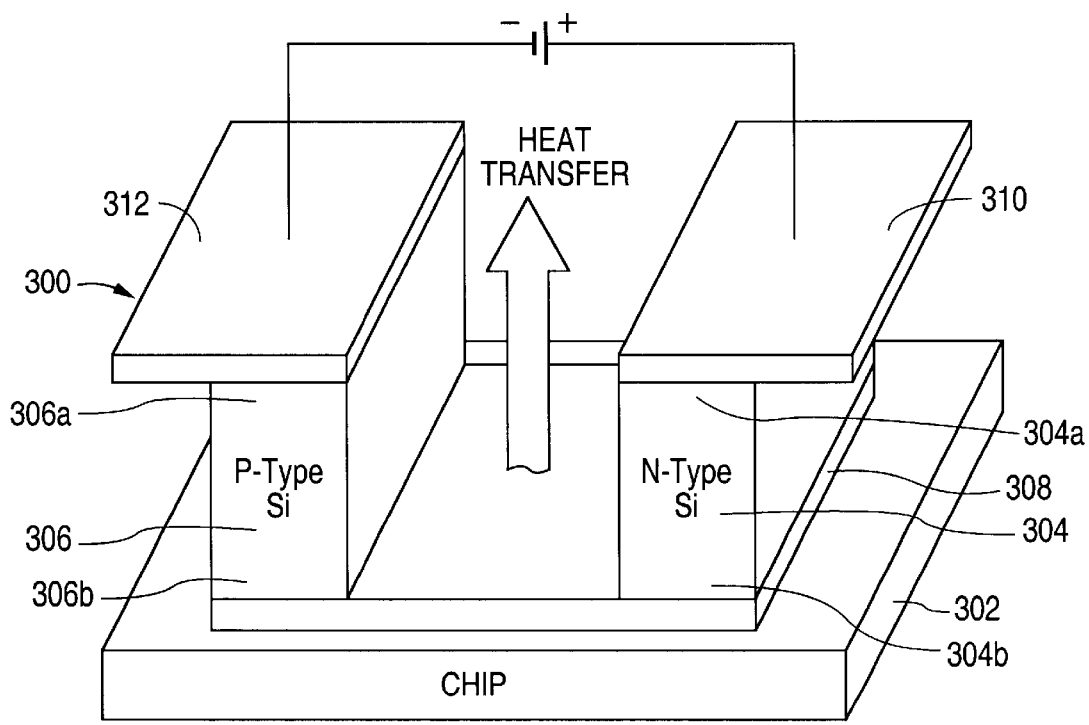
FIG. 3
(PRIOR ART)

TEMPERATURE CONTROL METHOD FOR INTEGRATED CIRCUIT

RELATED APPLICATION

This application is a divisional of application Ser. No. 09/866,976, filed May 29, 2001, now U.S. Pat. No. 6,476,508, which is a divisional of application Ser. No. 09/216,282, filed Dec. 18, 1998, now U.S. Pat. No. 6,281,120.

BACKGROUND OF THE INVENTION

1. Field of the Invention

The present invention relates to a temperature control structure for an integrated circuit, and in particular, to a temperature control structure fabricated on the surface of an integrated circuit that is capable of changing the heat distribution profile directly on the chip.

2. Description of the Related Art

As device sizes continue to shrink into the submicron region, packing densities have increased dramatically. One consequence of this heightened density is that the thermal energy generated by the operation of semiconducting devices is now a key factor that must be considered in designing a chip. Absent some form of heat management, heat from device operation could accumulate and degrade device performance.

FIG. 1 shows a schematic depiction of the Seebeck Effect. Due to this thermoelectric phenomenon, a Seebeck voltage ($V_s$) will be generated on aluminum contacts $Al_1$ and $Al_2$ when these contacts are connected to a second conductor of a different material (silicon), and when the $Al_1$ and $Al_2$ contacts are maintained at different temperatures $T_1$ and $T_2$ respectively. The Seebeck voltage generated is proportional to the temperature difference ($T_1-T_2$), with $$V_S = \alpha(T_1 - T_2)$$

where $\alpha$ is the Seebeck coefficient. Room temperature values of $\alpha$ are typically in the range of $-10.0$ to $+10.0$ $\mu V/°C$. With Al/Si junctions, values of $\alpha$ may be as large as 1.4 mV/°C., which is the same order of magnitude as the temperature coefficient of the base-emitter voltage ($V_{be}$) of a bipolar transistor.

FIG. 2 shows a schematic depiction of the Peltier Effect. The Peltier Effect is simply the converse of the Seebeck Effect. Under the Peltier Effect, current passed through junctions of dissimilar conductors (such as Al and Si) results in absorption of heat at one junction and the emission of heat at the other junction. Due to the frequent application of voltages to operate silicon type semiconductor devices having metal contacts, the Peltier Effect is perhaps the dominant thermal effect experienced by integrated circuits.

The Peltier and Seebeck Effects are related directly by $$(V_{SA} - V_{SB})_{T_1 T_2} = \int_{T_1}^{T_2} \frac{\Pi_{ab}}{T} dT$$

Since $\Pi_{ab}$ (Peltier) is defined per unit current flow, the power output ($V^*I$) from a Seebeck junction pair with a small temperature difference $\Delta T$ is related to the Peltier heat transfer by a factor of the form $\Delta T/T$.

In considering FIG. 2, it is important to note that the relative temperatures of $T_1$ and $T_2$ are directly related to the polarity of the voltage drop applied across the aluminum contacts. Therefore, reversing the polarity of the voltage source would make $T_1$ less than $T_2$.

It is also important to note that changing the conductivity type of the silicon bridge in FIG. 2 will also have the effect of reversing the relationship between $T_1$ and $T_2$. Thus, where the Si bridge is N-type rather than P-type as shown, $T_1$ would also be less than $T_2$.

The Peltier Effect has previously been used to manage heat generated on IC structures. FIG. 3 shows such a conventional Peltier structure as used to cool an IC present on a chip.

Conventional Peltier structure 300 includes monolithic blocks of N- and P-type conductivity type 304 and 306, respectively. N-type block 304 and P-type block 306 are typically composed of different Tellurium/Bismuth compounds. For example, $BiSb_4Te_{7.5}$ exhibits P-type properties, while $Bi_2Te_2Se$ is an N-type material.

Second end 304b of N-type block 304 and second end 306b of P-type block 306 are electrically connected by metal strip 308. First end 304a of N-type block 304 and first end 306a of N-type block 306 are connected to metal contacts 310 and 312, respectively.

As described in detail in connection with FIG. 2 above, application of a potential difference across contacts 310 and 312 results in a temperature change at metal strip 308, thus and on chip 302 in contact therewith. Specifically, as shown in FIG. 3 application of a negative voltage difference across N block contact 310 and P block contact 312 results in a temperature increase at contacts 310 and 312, and a corresponding temperature decrease at metal strip 308. Conversely, application of a positive voltage difference across N block contact 310 and P block contact 312 would result in a fall in the temperature of contacts 310 and 312 and a corresponding rise in the temperature of metal strip 308.

As is evident from the above description in connection with FIG. 3, application of a voltage difference to the conventional Peltier structure can result in temperature control of a chip. However, it is important to note that this conventional Peltier structure suffers from a number of serious disadvantages.

First, the temperature control exercised over the chip is crude and non-specific. In particular, the monolithic P- and N-type blocks making up the conventional Peltier structure are far larger than the individual semiconducting structures present on the chip. Application of a voltage to the conventional Peltier structure therefore necessitates a temperature change over the entire chip, and all component structures of an integrated circuit present thereon. Temperature control of specific structures of the integrated circuit, or even of selected regions of the chip, is not possible with the conventional Peltier structure.

Therefore, there is a need in the art for a temperature control device which enables highly specific and selective management of heat on an IC circuit present on a chip.

A second disadvantage associated with the conventional Peltier cell structure is the substantial power consumption of the device. A current in the range of between 3 and 5 Amp would typically be required to maintain a desired temperature change across the monolithic P and N type blocks shown. This is due in part to the sheer mass of the P- and N-type blocks of the Peltier cell, which dwarf any individual semiconducting structures present on the chip.

Therefore, there is a need in the art for a temperature control device which consumes relatively little power while effectively managing the temperature of an IC.

A third disadvantage associated with a conventional Peltier cell is the space consumed by the device. As shown in FIG. 3, transfer of thermal energy to and from the chip is accomplished in a direction out of the plane of the chip. This orientation consumes precious space present around the chip. This space is generally quite limited, due to the reduced size of portable applications such as laptop computers, as well as the necessary presence of nearby components such as circuit boards, chip packaging, buses, or other forms of communication structures.

Therefore, there is a need in the art for a temperature control device which occupies relatively little space and which can be incorporated into an IC device directly upon the surface of a semiconducting chip.

SUMMARY OF THE INVENTION

The present invention relates to a temperature control structure for an IC that can be fabricated directly on the chip surface. The structures in accordance with the present invention utilize the thermoelectric properties of the Peltier Effect to accomplish the temperature control function.

Specifically, the heat management structure in accordance with the present invention incorporates an array of Peltier cells fabricated directly upon the surface of the chip. Selective application of voltage to the temperature control structures present in the array may serve to generate "cold" regions at particular chip regions, facilitating channeling and dissipation of thermal energy generated thereupon.

An apparatus for controlling temperature on an integrated circuit in accordance with one embodiment of the present invention comprises a first doped region of a first conductivity type formed within a semiconducting material and having a first end and a second end, a first contact connected to the first end and in electrical communication with a voltage source, and a second contact connected to the second end and in electrical communication with the voltage source, wherein application of a potential difference across the first and second contacts changes a temperature of the first contact relative to the second contact.

A process for forming a temperature control structure in accordance with the present invention comprises the steps of comprises the steps of forming a first doped region of a first conductivity type within a semiconducting material, the first doped region having a first end and a second end, forming a first contact connected to the first end, forming a second contact connected to the second end, and connecting the first contact and the second contact to a voltage source.

A method for controlling temperature on an integrated circuit comprises the steps of providing a doped region in the silicon having a first end and a second end, the first end in connection with a first metal contact and the second end in connection with a second metal contact, and applying a potential difference across the first metal contact and the second metal contact whereby a temperature of the first metal contact changes relative to a temperature of the second metal contact because of the Peltier Effect.

The features and advantages of the present invention will be understood upon consideration of the following detailed description of the invention and the accompanying drawings.

BRIEF DESCRIPTION OF THE DRAWINGS

FIG. 1 shows a schematic depiction of the Seebeck Effect.

FIG. 2 shows a schematic depiction of the Peltier Effect.

FIG. 3 shows a perspective view of a conventional Peltier cell structure as used to cool an IC structure on a silicon chip.

DETAILED DESCRIPTION

Figure 4A:
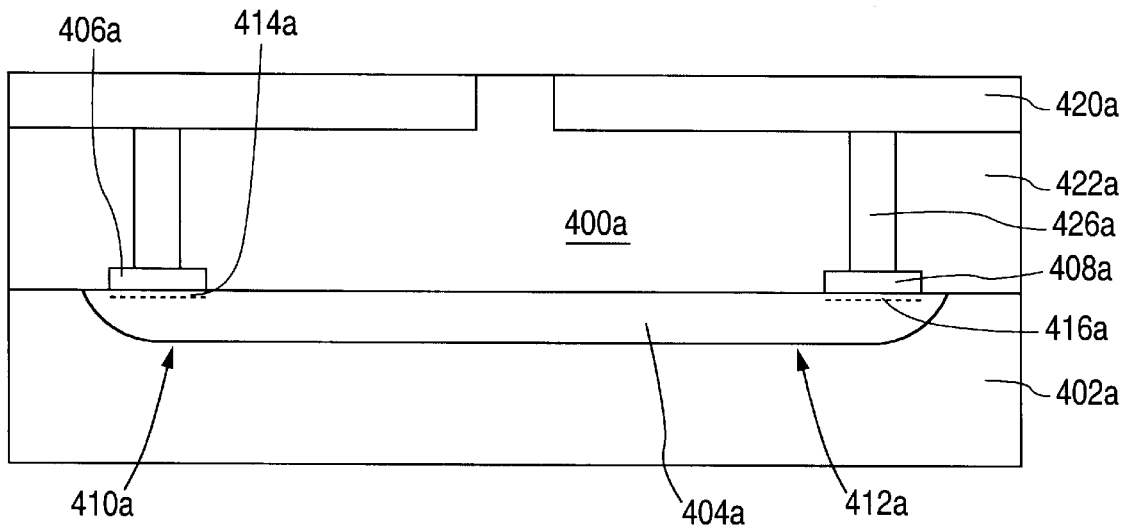
FIGS. 4A–4B show cross-sectional views of two embodiments of simple temperature control structures in accordance with the present invention.
Figure 4B:
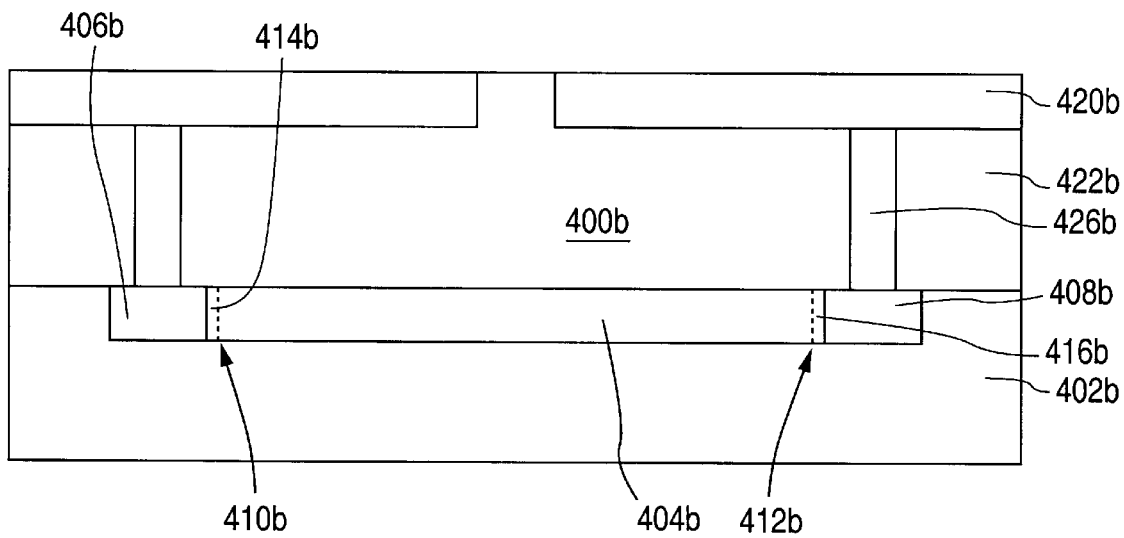

The present invention teaches temperature control structures for an integrated circuit utilizing the Peltier Effect which are formed directly on the surface of a chip. FIGS. 4A–4B show cross-sectional views of two simple embodiments of a temperature control structure in accordance with the present invention.

FIG. 4A shows temperature control structure 400a formed within silicon block 402a. Temperature control structure 400a includes silicon region 404a containing N-type dopant. N-type region 404a may be formed in a variety of ways, including ion-implantation or chemical vapor deposition followed by thermal diffusion.

N-type region 404a also includes metal contacts 406a and 408a formed over first end 410a and second end 412a, respectively. Metal contacts 406a and 408a may be formed by conventional metallization processing steps, as are commonly employed to create interconnect lines of an integrated circuit.

Metal contacts 406a and 408a of N-type region 404a are in electrical communication with other portions of the integrated circuit through metallization layer 420a by way of via 426a. Temperature control structure 400a is otherwise thermally and electrically isolated from metallization layer 420a by intervening dielectric layer 422a.

As is evident from discussion of the Peltier Effect in connection with FIG. 2, application of a voltage potential across metal contacts 406a and 408a will create a temperature gradient across N-type doped region 404a. Specifically, application of a negative potential difference between metal contact 406a and metal contact 408a will create a high temperature region in the vicinity of the junction 414a between metal contact 406a and doped region 404a, and a corresponding low temperature region in the vicinity of the junction 416a between metal contact 408a and doped region 404a.

In this manner, the temperature control structure is seen to control the distribution of thermal energy over highly specific regions of the silicon block. Changing the type and/or concentration of conductivity-altering dopant present in the doped region will affect the character of this temperature control. Changing the magnitude and/or polarity of the voltage drop applied across the metal contacts will also affect the character of the temperature control exerted.

FIG. 4B shows temperature control structure 400b that is formed within silicon block 402b. Temperature control structure 400b includes silicon region 404b containing N-type dopant. Metal contacts 406b and 408b are formed directly in silicon block 402b adjacent to first end 410b and second end 412b of doped silicon region 404b. This may be accomplished by etching holes into silicon block 402b, and then filling these holes with metal.

As with temperature control structure 400a depicted in FIG. 4, metal contacts 406b and 408b are in electrical communication with an overlying metallization layer 420b by way of via 426b. Temperature control structure 400b is otherwise thermally and electrically isolated from metallization layer 420b by intervening dielectric layer 422b.

Because the metal contacts 406b and 408b of the embodiment shown in FIG. 4B are positioned directly in the silicon block 402b, the metal/silicon junctions 414b and 416b are oriented transverse to the direction of heat conduction through the silicon, thereby distributing the flowing heat uniformly through the depth of the silicon. This is somewhat different from the embodiment shown in FIG. 4A, where thermal energy is conducted upward to laterally oriented metal silicon junctions 414a and 414b positioned over the silicon. Despite this slight difference in spatial orientation, the embodiments shown in FIGS. 4A and 4B should operate with similar efficiencies.

Figure 5:
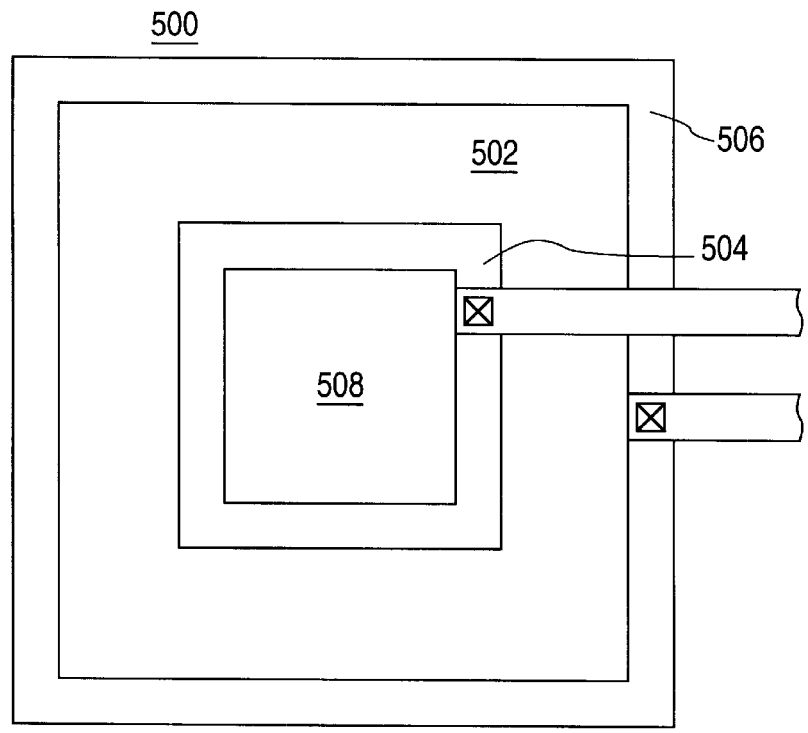
FIG. 5 shows a top view of a square temperature control structure in accordance with a first alternative embodiment of the present invention.

FIG. 5 shows a top view of a square temperature control structure in accordance with a first alternative embodiment of the present invention. Square temperature control structure 500 includes a square doped region 502 having interior metal contact 504 and exterior metal contact 506. Application of a potential drop across contacts 504 and 506 will give rise to a change of temperature at the junction between contacts 504 and 506 and square doped region 502. This Peltier heating or cooling will affect the thermal environment of central region 508.

Figure 6:
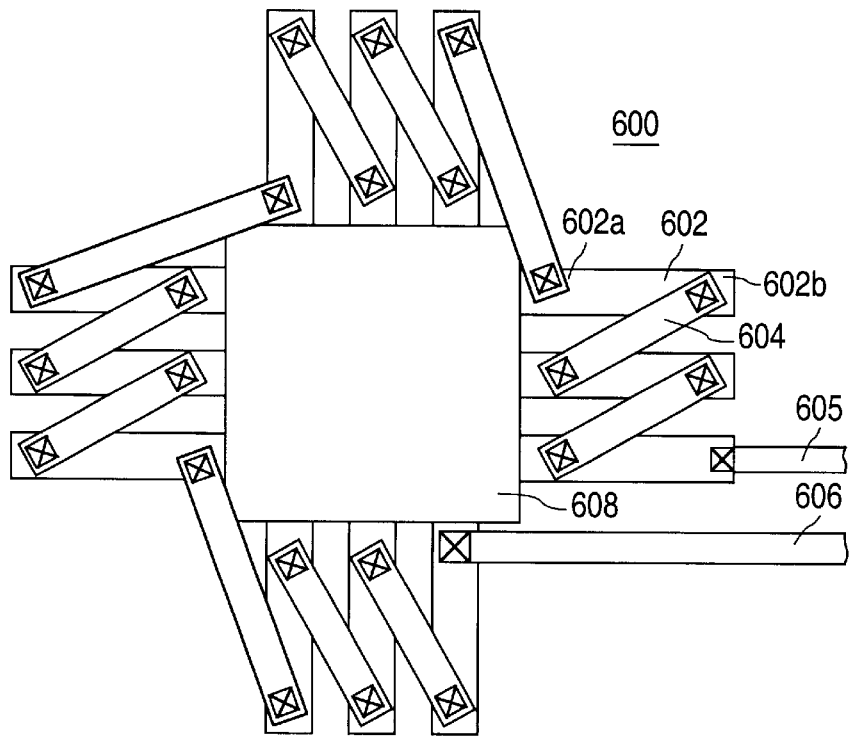
FIG. 6 shows a top view of a temperature control structure utilizing multiple doped regions in accordance with a second alternative embodiment of the present invention.

FIG. 6 shows a top view of a temperature control structure utilizing an array of doped regions of the same conductivity type in accordance with a second alternative embodiment of the present invention. Temperature control structure 600 includes multiple doped regions 602 of the same conductivity type having first and second ends 602a and 602b, respectively. First ends 602a are oriented around the periphery of central region 608. The first and second ends of successive doped regions 602 are electrically linked by metal bridges. 604. Application of a potential drop across contacts 605 and 606 will give rise to a change in temperature at the junction between the metal bridges 604 and doped regions 602. This Peltier heating or cooling will affect the thermal environment of central region 608.

One feature of temperature control structure 600 that enhances its effectiveness relative to the embodiments shown in FIGS. 4A, 4B, and 5 is utilization of an array of multiple doped regions rather than a single doped region. This design offers a larger number of metal/silicon junctions at which temperature differences can arise and serve to conduct heat on the chip.

Figure 7:
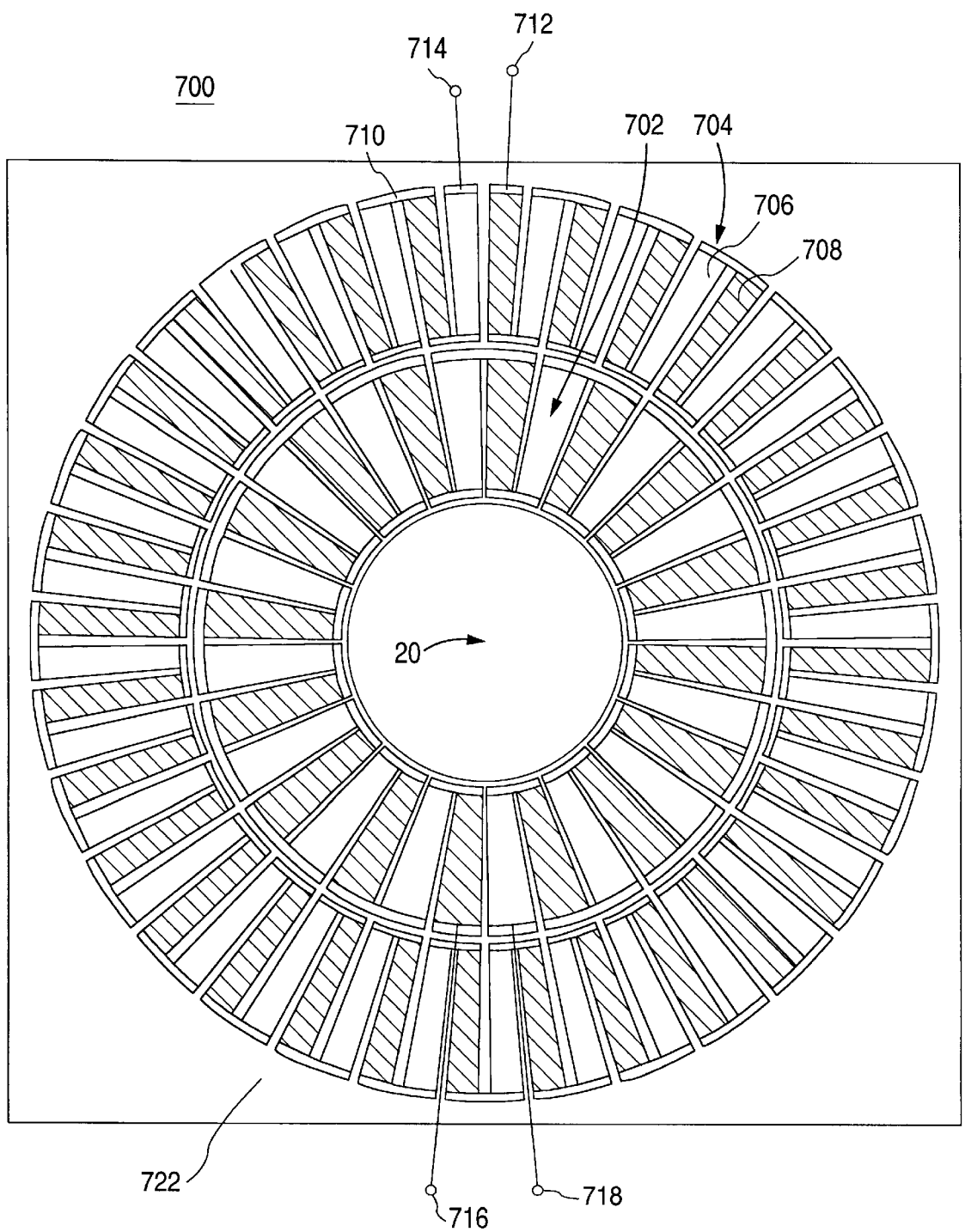
FIG. 7 shows a top view of a circular array of Peltier cells having doped regions of the opposite conductivity type in accordance with a third alternative embodiment of the present invention.

FIG. 7 shows a top view of a circular array of Peltier cells having doped regions of the opposite conductivity type comprising a cooling structure in accordance with a third alternate embodiment of the present invention. Cooling structure 700 consists of circular array 702 of Peltier cells inlaid within circular array 704 of Peltier cells. Both circular arrays 702 and 704 consist of Peltier cells of alternating N- and P-type silicon regions 706 and 708, respectively, connected by an electrically conducting bridge structure 710. External circular array 704 is connected to a voltage supply by way of contacts 712 and 714. Internal circular array 702 is connected to a voltage supply by way of contacts 716 and 718.

Due to the Peltier Effect described above, application of a potential difference across contacts 712 and 714 of external circular array 704, and also across contacts 716 and 71B of internal circular array 702, creates low temperature region 720 at the center of internal circular array 702, with higher temperatures generated at region 722 lying along the periphery of external circular array 704.

Semiconducting devices located at the center of internal array 702 will therefore be maintained at a constant, lower temperature than silicon at the periphery of external array 704. The constant ambient temperature inside internal array 702 will ensure reliable operation of the semiconductor devices located therein.

Several key design features of temperature control structure 700 enhance its efficiency and effectiveness as compared to the embodiments shown in FIGS. 4A, 4B, and 5–6. First, utilization of paired doped regions of the opposite conductivity type simplifies construction of the array by permitting the same ends of the doped regions to be connected by the metal bridges. Second, the use of multiple consecutive tiers of arrays compounds the degree temperature control exerted over the integrated circuit. Finally, the circular shape of the array encompassing the central area maximizes convection of thermal energy to and from this smaller area of the array distributing heat within the larger peripheral regions of the array.

Although the invention has been described above in connection with one specific preferred embodiment, it should be understood that the invention as claimed should not be unduly limited to such specific embodiments. Various other modifications and alterations in the structure and method of operation of this invention will be apparent to those skilled in the art without departing from the scope of the present invention.

For example, while device 700 of FIG. 7 is described as a cooling structure, the present invention is not limited to that specific application. Heating of specific structures or regions of an integrated circuit could also be accomplished utilizing the principles in accordance with the present invention.

Furthermore, while the array shown in FIG. 7 is circular in shape and includes two separate tiers of Peltier cells, the present invention is not limited to this configuration. Arrays of various shapes containing any number of tiers of Peltier cells may be employed and still fall within the scope of the present invention.

Figure 8:
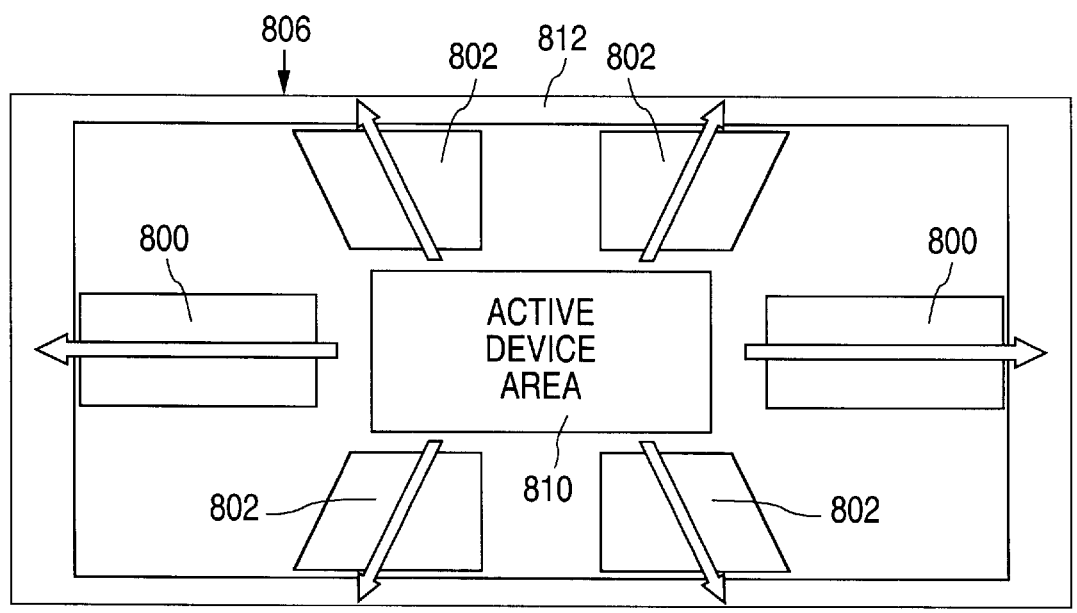
FIG. 8 shows a top view of a silicon chip bearing cooling structures in accordance with the present invention.

Thus, FIG. 8 shows a top view of a silicon chip bearing cooling structures in accordance with the present invention. As shown in FIG. 8, rectangular arrays 800 and trapezoidal arrays 802 of Peltier cells are carefully positioned on the surface of chip 806 to conduct thermal energy away from active device area 810 to periphery 812 of chip 806. In this manner, circuit components located within active device area 810 may be maintained at a constant (low) temperature.

Figure 9:
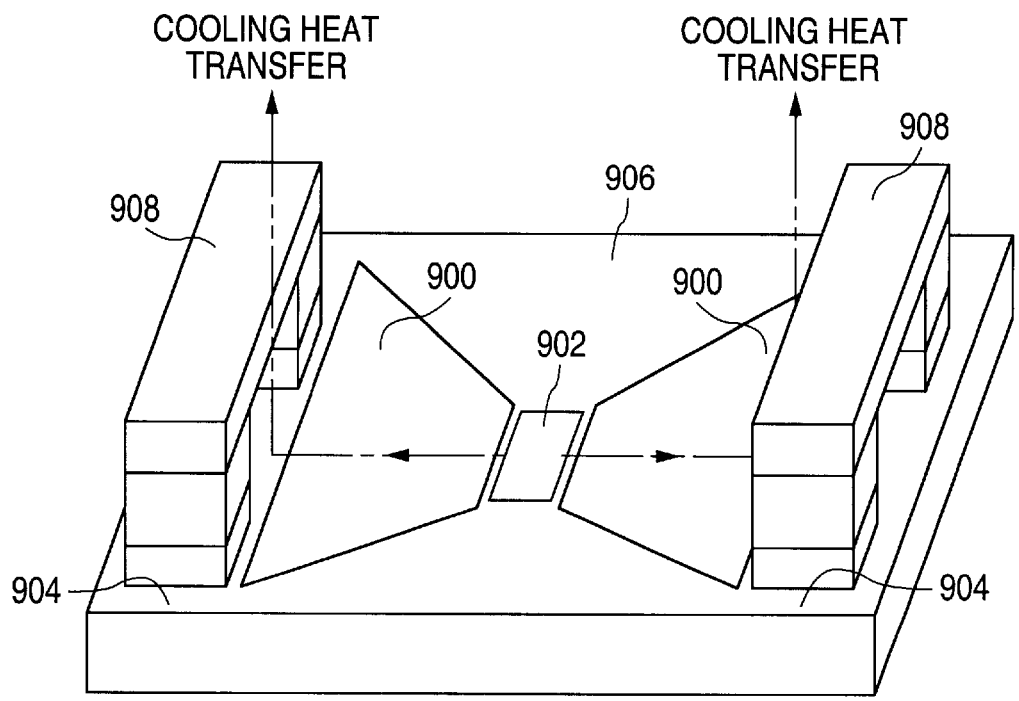
FIG. 9 shows a perspective view of a hybrid chip bearing both conventional Peltier structures and arrays of Peltier cell structures in accordance with the present invention.

Moreover, the temperature control device in accordance with the present invention may be used in conjunction with a conventional Peltier device. FIG. 9 shows a perspective-view of a hybrid chip bearing both conventional Peltier structures and arrays of Peltier cell structures in accordance with the present invention. Peltier cell arrays 900 in accordance with the present invention conduct heat from active region 902 to the periphery 904 of chip 906. Conventional Peltier structures 908 in contact with chip periphery 904 may then efficiently remove heat in a direction normal to the surface of the chip, as shown by the arrows in FIG. 9.

Therefore, it is intended that the following claims define the scope of the present invention, and that the methods and structures within the scope of these claims and their equivalents be covered hereby.

The following co-pending, commonly assigned patent applications contain subject matter related to the present application, and are incorporated herein by reference: U.S. patent application Ser. No. 09/216,032, entitled "TEMPERATURE REGULATOR CIRCUIT AND PRECISION VOLTAGE REFERENCE FOR INTEGRATED CIRCUIT".

What is claimed is:

1. A method of controlling the temperature of an integrated circuit, the method comprising:

(a) forming an integrated circuit structure in a semiconductor substrate, the integrated circuit structure including (i) a doped region of a first conductivity type formed in the semiconductor substrate, the doped region having a first end in electrical connection with a first conductive contact and a second end in electrical connection with a second conductive contact; and (ii) a layer of conductive interconnect material that is spaced apart from the doped region by a layer of dielectric material, the layer of conductive interconnect material being electrically connected to the first conductive contact by a first conductive via that extends through the layer of dielectric material and the second conductive contact by a second conductive via, spaced apart from the first conductive via, that extends through the layer of dielectric material, the layer of conductive interconnect material being connected to a voltage source; and (b) applying a potential difference across the first conductive contact and the second conductive contact such that a temperature of the first conductive contact changes relative to a temperature of the second conductive contact.

2. The method of claim 1, and wherein the step of forming an integrated circuit structure comprises providing a doped region in the semiconductor substrate wherein the doped region includes a plurality of alternating doped regions of opposite conductivity type connected by electrically conducting bridges.

3. The method of claim 1, and wherein the semiconductor substrate comprises crystalline silicon.

4. The method of claim 3, and wherein the first conductive contact and the second conductive contact comprise a metal.

5. The method of claim 4, and wherein the first conductivity type is N-type.

* * * * *